US012598839B2

(12) United States Patent

Cho et al.

(10) Patent No.: US 12,598,839 B2
(45) Date of Patent: Apr. 7, 2026

(54) LIGHT EMITTING DEVICE FOR DISPLAY AND DISPLAY APPARATUS HAVING THE SAME

(71) Applicant: Seoul Viosys Co., Ltd., Ansan-si (KR)

(72) Inventors: Dae Sung Cho, Ansan-si (KR); So Ra Lee, Ansan-si (KR); Chang Yeon Kim, Ansan-si (KR); Jong Min Jang, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 18/231,203

(22) Filed: Aug. 7, 2023

(65) Prior Publication Data

US 2023/0387179 A1 Nov. 30, 2023

Related U.S. Application Data

(63) Continuation of application No. 17/030,301, filed on Sep. 23, 2020, now Pat. No. 11,798,974.

(Continued)

(51) Int. Cl.
*H10H 20/813* (2025.01)
*H10H 20/811* (2025.01)
(Continued)

(52) U.S. Cl.
CPC ...... *H10H 20/8131* (2025.01); *H10H 20/811* (2025.01); *H10H 20/8312* (2025.01);
(Continued)

(58) Field of Classification Search
None
See application file for complete search history.

(56) References Cited

U.S. PATENT DOCUMENTS

| | | | | |
|---|---|---|---|---|
| 5,087,949 A | * | 2/1992 | Haitz | H01L 33/0062 |
| | | | | 257/E33.068 |
| 5,233,204 A | * | 8/1993 | Fletcher | H01L 33/0062 |
| | | | | 257/97 |

(Continued)

FOREIGN PATENT DOCUMENTS

| | | |
|---|---|---|
| CN | 1885579 A | 12/2006 |
| CN | 107256862 A | 10/2017 |

(Continued)

OTHER PUBLICATIONS

Extended European Search Report dated Jul. 9, 2023, issued to European Patent Application No. 20869362.2.

(Continued)

*Primary Examiner* — Feifei Yeung Lopez
(74) *Attorney, Agent, or Firm* — Oblon, McClelland, Maier & Neustadt, L.L.P.

(57) ABSTRACT

A display apparatus including a circuit board, pixels arranged on the circuit board, and a light blocking material covering one of the pixels, in which at least one of the pixels includes a first light emitting device and a second light emitting device spaced apart from each other, the first light emitting device includes a first LED stack configured to generate light having a first peak wavelength and a first bump pad, the second light emitting device includes a second LED stack configured to generate light having a second peak wavelength and a second bump pad, and the first light emitting device includes a first side surface having a region inclined at a first inclined angle, and the second light emitting device includes a second side surface facing the first side surface and having a region inclined at a second inclined angle different from the first inclined angle.

20 Claims, 8 Drawing Sheets

100GB

Related U.S. Application Data

(60) Provisional application No. 62/907,116, filed on Sep. 27, 2019.

(51) Int. Cl.

| | |
|---|---|
| *H10H 20/831* | (2025.01) |
| *H10H 20/85* | (2025.01) |
| *H10H 20/851* | (2025.01) |
| *H10H 20/857* | (2025.01) |
| *H10H 29/14* | (2025.01) |

(52) U.S. Cl.
CPC ...... *H10H 20/8506* (2025.01); *H10H 20/851* (2025.01); *H10H 20/857* (2025.01); *H10H 29/142* (2025.01)

(56) References Cited

U.S. PATENT DOCUMENTS

| | | | | |
|---|---|---|---|---|
| 5,602,418 | A * | 2/1997 | Imai | H01L 21/02433 |
| | | | | 257/E21.097 |
| 6,869,812 | B1 * | 3/2005 | Liu | H01L 33/24 |
| | | | | 257/E33.072 |
| 10,103,195 | B2 | 10/2018 | Damilano et al. | |
| 11,798,974 | B2 * | 10/2023 | Cho | H01L 27/156 |
| 2004/0070333 | A1 | 4/2004 | Lin et al. | |
| 2005/0067627 | A1 | 3/2005 | Shen et al. | |
| 2007/0069220 | A1 | 3/2007 | Ogihara | |
| 2008/0031004 | A1 | 2/2008 | Chu | |
| 2009/0078955 | A1 | 3/2009 | Fan et al. | |
| 2009/0272989 | A1 | 11/2009 | Shum et al. | |
| 2011/0204376 | A1 | 8/2011 | Su et al. | |
| 2012/0170253 | A1 | 7/2012 | Park et al. | |
| 2012/0223345 | A1 * | 9/2012 | Tomoda | H01L 33/46 |
| | | | | 257/89 |
| 2013/0181197 | A1 | 7/2013 | Lee et al. | |
| 2013/0214302 | A1 * | 8/2013 | Yeh | H01L 25/0753 |
| | | | | 438/27 |
| 2015/0102367 | A1 * | 4/2015 | Lee | H10H 20/825 |
| | | | | 257/88 |
| 2016/0293811 | A1 * | 10/2016 | Hussell | H01L 33/60 |
| 2018/0375000 | A1 | 12/2018 | Kim et al. | |
| 2019/0019839 | A1 | 1/2019 | Tian et al. | |
| 2019/0049760 | A1 | 2/2019 | Hyun et al. | |
| 2019/0165038 | A1 | 5/2019 | Chae et al. | |
| 2019/0214373 | A1 | 7/2019 | Kim et al. | |
| 2019/0267436 | A1 | 8/2019 | Zhang et al. | |
| 2020/0058824 | A1 | 2/2020 | Jang et al. | |

FOREIGN PATENT DOCUMENTS

| | | | |
|---|---|---|---|
| CN | 108702827 | A | 10/2018 |
| JP | 2007-95844 | A | 4/2007 |
| JP | 2015-92529 | | 5/2015 |
| JP | 2015-173222 | | 10/2015 |
| JP | 2018-505567 | A | 2/2018 |
| JP | 2019-512718 | A | 5/2019 |
| KR | 10-2008-0005642 | | 1/2008 |
| KR | 10-1100579 | | 1/2012 |
| KR | 10-1268543 | | 5/2013 |
| KR | 10-2016-0007355 | | 1/2016 |
| KR | 10-2016-0139004 | | 12/2016 |
| KR | 10-2017-0099325 | | 8/2017 |
| WO | WO 2009/041318 | A1 | 4/2009 |
| WO | WO 2019/124952 | A1 | 6/2019 |

OTHER PUBLICATIONS

Non-Final Office Action dated Jul. 29, 2022, issued to U.S. Appl. No. 17/030,301.

Final Office Action dated May 10, 2023, issued to U.S. Appl. No. 17/030,301.

Notice of Allowance dated Jul. 26, 2023, issued to U.S. Appl. No. 17/030,301.

International Search Report dated Jan. 12, 2021, issued to PCT/KR2020/012977 (with English Translation).

Office Action mailed Feb. 10, 2025 in Korean Application No. 10-2022-7004586 filed Sep. 24, 2020 (w/English translation).

Combined Chinese Office Action and Search Report issued on Jun. 25, 2025 in Chinese Patent Application No. 202080067591.8, 8 pages.

Japanese Office Action issued Aug. 5, 2025 in Japanese Patent Application No. 2024-181949, 7 pages.

Japanese Office Action issued Jun. 25, 2024 in Japanese Application 2022-518314, 4 pages.

Office Action mailed Jan. 6, 2026, in Japanese Application No. 2024-181949 filed Oct. 17, 2024 (w/English translation).

* cited by examiner

1000a

1000b

1000c

LIGHT EMITTING DEVICE FOR DISPLAY AND DISPLAY APPARATUS HAVING THE SAME

CROSS REFERENCE TO RELATED APPLICATIONS

This application is a Continuation of U.S. patent application Ser. No. 17/030,301, filed on Sep. 23, 2020, which claims the benefit of U.S. Provisional Patent Application No. 62/907,116 filed on Sep. 27, 2019, each of which is hereby incorporated by reference for all purposes as if fully set forth herein.

BACKGROUND

Field

Exemplary embodiments of the invention relate generally to a light emitting device for display and a display apparatus, and, more particularly, to a light emitting device for a display having a stacked structure of LEDs and a display apparatus having the same.

Discussion of the Background

As an inorganic light source, light emitting diodes have been used in various technical fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been used as backlight light sources in display apparatuses. However, in a display apparatus using white light as a backlight source, it is generally difficult to perceive a screen in a bright place due to limited luminous intensity of the display apparatus, and also it may not implement high-quality displays as not having a self-illuminated structure. To solve disadvantages of the display apparatus using white light as a backlight source, studies have been actively conducted recently on micro LEDs in which blue, green, and red light emitting diodes function directly as pixels to display images.

In general, a display apparatus realizes various colors through mixture of blue, green, and red light. In order to display various images, a display apparatus includes a plurality of pixels, each including sub-pixels that correspond to blue, green, and red light, respectively. In this manner, a color of a certain pixel is determined based on the colors of the sub-pixels so that images can be displayed through combination of such pixels.

Since LEDs can emit various colors depending upon materials thereof, a display apparatus may be provided by arranging individual LED chips emitting blue, green, and red light on a two-dimensional plane. However, when one LED chip is provided to each sub-pixel, the number of LED chips may be increased, which may require excessive time for a mounting process during manufacture. In general, when a display apparatus employs micro LEDs, millions to tens of millions of LEDs have to be mounted on a substrate, which may lower productivity and increase costs.

Furthermore, since the sub-pixels are arranged on a two-dimensional plane in the display apparatus, a relatively large area is occupied by one pixel that includes the sub-pixels for blue, green, and red light. Thus, an area of each LED chip should be reduced in order to arrange the sub-pixels in a restricted area. However, reduction in size of LED chips may make it difficult for LED chips to be mounted, and may also reduce luminous area, which may decrease luminous intensity.

Meanwhile, a display apparatus realizing various colors needs to consistently provide high-quality white light. Conventional TVs use an RGB mixing ratio of 3:6:1 to realize the standard white light of D65. More particularly, luminous intensity of red is higher than that of blue, and luminous intensity of green is relatively the highest. However, since the current LED chip has a relatively very high luminous intensity of blue LEDs compared to other LEDs, it is difficult to match the RGB mixing ratio in the display apparatus using LED chips.

The above information disclosed in this Background section is only for understanding of the background of the inventive concepts, and, therefore, it may contain information that does not constitute prior art.

SUMMARY

Light emitting devices constructed according to exemplary embodiments of the invention are capable of increasing an area of each sub-pixel in a restricted pixel area and a display apparatus including the same.

Exemplary embodiments also provide a light emitting device for a display that is capable of reducing a time associated with a mounting process and a display apparatus including the same.

Exemplary embodiments further provide a light emitting device for a display that capable of increasing the production yield and a display apparatus including the same.

Exemplary embodiments still provide a light emitting device and a display apparatus that are capable of easily controlling an RGB mixing ratio.

Additional features of the inventive concepts will be set forth in the description which follows, and in part will be apparent from the description, or may be learned by practice of the inventive concepts.

A display apparatus according to an exemplary embodiments includes a circuit board, and a plurality of pixels arranged on the circuit board, in which at least one of the pixels includes a first light emitting device and a second light emitting device spaced apart from each other, the first light emitting device includes a first LED stack configured to generate light having a first peak wavelength, and the second light emitting device includes a second LED stack configured to generate light having a second peak wavelength, and a third LED stack disposed on the second LED stack and configured to generate light having a third peak wavelength.

A light emitting device for a display according to another exemplary embodiment includes a lower LED stack including a first conductivity type semiconductor layer and a second conductivity type semiconductor layer, an upper LED stack disposed on the lower LED stack and including a first conductivity type semiconductor layer and a second conductivity type semiconductor layer, a bonding material layer bonding the lower LED stack and the upper LED stack, and a common electrode electrically connected to the second conductivity type semiconductor layers of the lower and upper LED stacks or to the first conductivity type semiconductor layers of the lower and upper LED stacks, in which the light emitting device is configured to emit light having only two peak wavelengths.

A display apparatus according to yet another exemplary embodiment includes a circuit board, and a plurality of pixels arranged on the circuit board, in which at least one of the pixels includes a first LED stack configured to generate light having a first peak wavelength, a second LED stack spaced apart from the first LED stack and configured to generate light having a second peak wavelength, and a third LED stack disposed on the second LED stack and configured to generate light having a third peak wavelength.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
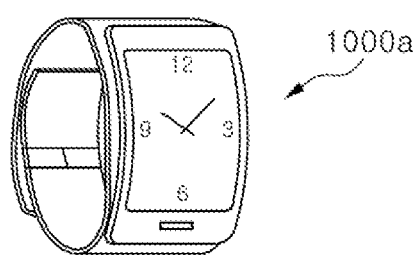
FIG. 1 shows schematic perspective views of display apparatuses according to exemplary embodiments.
Figure 1:
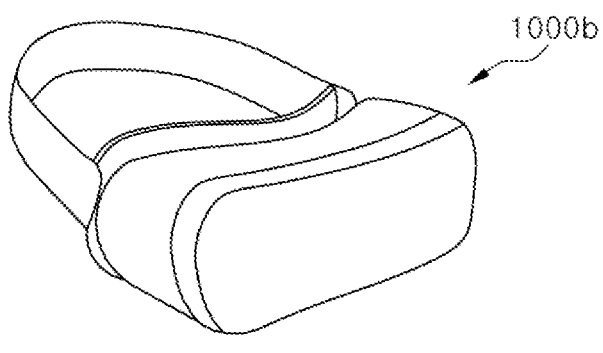
Figure 1:
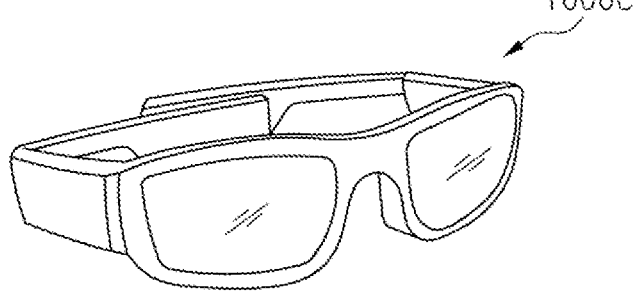

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display apparatus according to an exemplary embodiment includes: a circuit board, and a plurality of pixels arranged on the circuit board, in which at least one of the pixels includes a first light emitting device and a second light emitting device spaced apart from the first light emitting device in a lateral direction. The first light emitting device includes a first LED stack generating light of a first peak wavelength, and the second light emitting device includes a second LED stack generating light of a second peak wavelength and a third LED stack disposed on the second LED stack and generating light of a third peak wavelength.

Since the second light emitting device includes the second LED stack and the third LED stack overlapped with each other, the number of mounting processes of the light emitting devices may be reduced, and a luminous area of each sub-pixel may be increased without increasing a pixel area.

The first peak wavelength is a longer wavelength than the second and third peak wavelengths. The first LED stack having the longer wavelength may operate under a relatively low voltage compared to the second and third LED stacks. As such, the second and third LED stacks are disposed to be overlapped with each other in the second light emitting device and the first LED stack is disposed to be spaced apart from the second light emitting device, and thus, the first light emitting device and the second light emitting device may be driven using different power sources from each other. However, the inventive concepts are not limited thereto.

In an exemplary embodiment, the second peak wavelength may be a longer wavelength than the third peak wavelength. As such, light having the relatively longer wavelength of the second peak wavelength may be easily emitted to the outside through the third LED stack without light loss. In another exemplary embodiment, the second peak wavelength may be a shorter wavelength than the third peak wavelength. In this case, light having the relatively short wavelength light of the second peak wavelength may be partially lost while passing through the third LED stack, and accordingly, luminous intensity of light having the second peak wavelength may be reduced. As such, the luminous intensity of light of the second peak wavelength emitted to the outside may be reduced, and thus, luminous intensities of light of the second peak wavelength and light of the third peak wavelength may be adjusted.

For example, the first, second, and third LED stacks may emit red light, blue light, and green light, respectively.

The display apparatus may further include a light blocking material covering side surfaces of the first light emitting device and the second light emitting device. Moreover, the light blocking material may cover upper surfaces of the first light emitting device and the second light emitting device.

In an exemplary embodiment, the upper surface of the second light emitting device may be placed higher than that of the first light emitting device. In another exemplary embodiment, the upper surfaces of the first light emitting device and the second light emitting device may be placed at substantially the same elevation.

Each of the first, second, and third LED stacks may include a first conductivity type semiconductor layer and a second conductivity type semiconductor layer, and the second light emitting device may include a common anode electrode electrically connected to the second conductivity type semiconductor layers of the second and third LED stacks, or a common cathode electrode electrically connected to the first conductivity type semiconductor layers.

As the second light emitting device includes the common cathode electrode or the common anode electrode, the number of bonding pads may be reduced.

Furthermore, the first conductivity type semiconductor layer or the second conductivity type semiconductor layer of the first LED stack may be electrically connected to the common anode electrode or the common cathode electrode.

In some exemplary embodiments, the first light emitting device may include at least two active layers stacked using a tunnel junction. As such, luminous intensity of the first light emitting device may be increased.

In an exemplary embodiment, the second conductivity type semiconductor layer of the second LED stack and the second conductivity type semiconductor layer of the third LED stack may be electrically connected to each other by bonding.

The circuit board may extend in a left and right direction and in an up and down direction with respect to a displayed screen, and the first and second light emitting devices may be arranged in the up and down direction. As such, color deviation in the left and right direction on the displayed screen may be reduced.

A light emitting device for a display according to another exemplary embodiment includes: a lower LED stack including a first conductivity type semiconductor layer and a second conductivity type semiconductor layer; an upper LED stack including a first conductivity type semiconductor layer and a second conductivity type semiconductor layer and disposed on the lower LED stack; and a bonding material layer bonding the lower LED stack and the upper LED stack; and a common anode electrode electrically connected to the second conductivity type semiconductor layers of the lower and upper LED stacks or a common cathode electrode electrically connected to the first conductivity type semiconductor layers, in which the light emitting device emits light having only two peak wavelengths.

Light of the two peak wavelengths may be green light and blue light. In an exemplary embodiment, the lower LED stack may emit green light, the upper LED stack may emit blue light, and blue light may be emitted to the outside passing through the lower LED stack. However, in another exemplary embodiment, the lower LED stack may emit blue light, and the upper LED stack may emit green light.

The light emitting device for a display may further include individual electrodes electrically connected to the first conductivity type semiconductor layers or the second conductivity type semiconductor layers, respectively.

As such, the lower LED stack and the upper LED stack may be driven independently using the individual electrodes and the common electrode.

The light emitting device for a display may further include a substrate disposed under the lower LED stack, in which the substrate may be a growth substrate of the lower LED stack.

A display apparatus according to another exemplary embodiment includes: a circuit board; and a plurality of pixels arranged on the circuit board, in which at least one of the pixels includes a first LED stack generating light of a first peak wavelength; a second LED stack spaced apart from the first LED stack in the lateral direction, and generating light of a second peak wavelength; and a third LED stack disposed on the second LED stack, and generating light of a third peak wavelength.

The circuit board may have a left and right direction and an up and down direction with respect to a displayed screen, and the first and second light emitting devices may be arranged in the up and down direction.

Light of the third peak wavelength may have a longer wavelength than light of the second peak wavelength.

Hereinafter, exemplary embodiments of the inventive concepts will be described in detail with reference to the accompanying drawings.

FIG. 1 shows schematic perspective views illustrating display apparatuses according to exemplary embodiments.

The display apparatus according to exemplary embodiments may be used in a VR display apparatus, such as a smart watch 1000a or a VR headset 1000b, or an AR display apparatus, such as augmented reality glasses 1000c, but the inventive concepts are not limited thereto.

The display apparatus may include a display panel for implementing an image.

Figure 2:
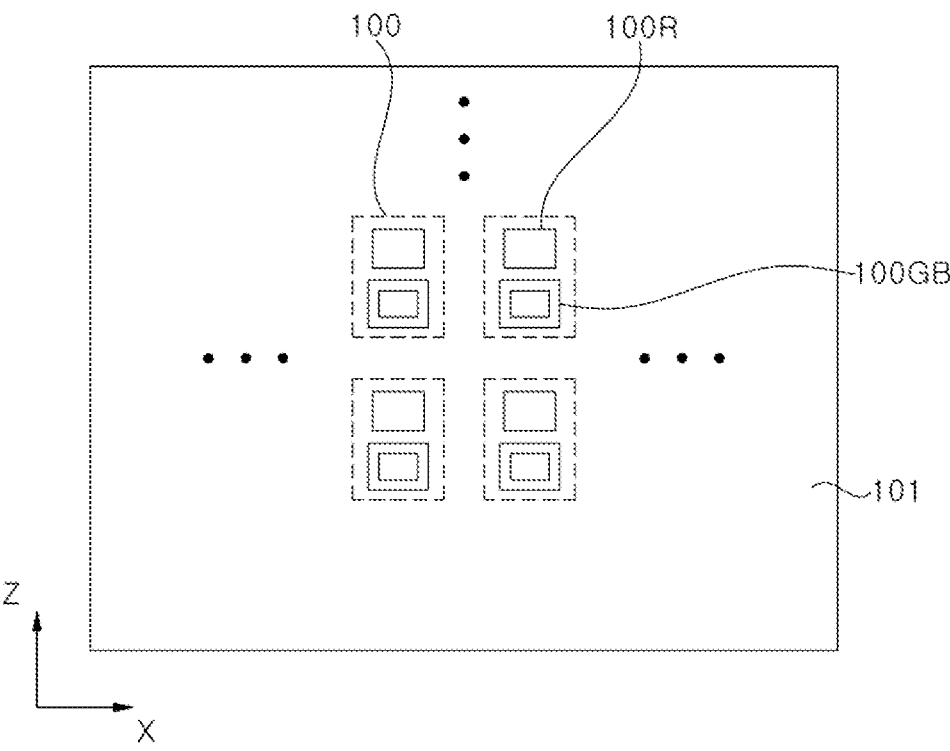
FIG. 2 is a schematic plan view illustrating a display panel according to an exemplary embodiment.

FIG. 2 is a schematic plan view illustrating the display panel according to an exemplary embodiment.

Referring to FIG. 2, the display panel includes a circuit board 101 and pixels 100.

The circuit board 101 may include a circuit for passive matrix driving or active matrix driving. In an exemplary embodiment, the circuit board 101 may include interconnection lines and resistors therein. In another exemplary embodiment, the circuit board 101 may include interconnection lines, transistors, and capacitors. The circuit board 101 may also have pads disposed on an upper surface thereof to allow electrical connection to the circuit therein.

A plurality of pixels 100 are arranged on the circuit board 101. Each of the pixels 100 may include a first light emitting device 100R and a second light emitting device 100GB. However, the inventive concepts are not limited thereto, and in some exemplary embodiments, at least one pixel 100 may include another light emitting device in addition to the first and second light emitting devices 100R and 100GB.

The second light emitting device 100GB is spaced apart from the first light emitting device 100R in the lateral direction. In particular, when a displayed screen is defined with a left and right direction (e.g., x-direction) and an up and down direction (e.g., z-direction), the first light emitting device 100R and the second light emitting device 100GB may be spaced apart in the z-direction, for example, as shown in FIG. 2. More particularly, the second light emitting device 100GB may be spaced apart in the up and down direction from the first light emitting device 100R. Although the second light emitting device 100GB is exemplarily illustrated as being disposed under the corresponding first light emitting device 100R, the inventive concepts are not limited thereto, and in some exemplary embodiments, the first light emitting device 100R may be disposed under the corresponding second light emitting device 100GB. In general, when viewing the displayed screen, color deviation in the left and right direction may be more sensitively perceived by a user than in the up and down direction. As such, the first light emitting device 100R and the second light emitting device 100GB according to an exemplary embodiment may be arranged in the up and down direction, thereby preventing or at least suppressing the occurrence of color deviation in the left and right direction (e.g., x-direction).

The structures of the first light emitting device 100R and the second light emitting device 100GB will be described in more detail below.

Figure 3A:
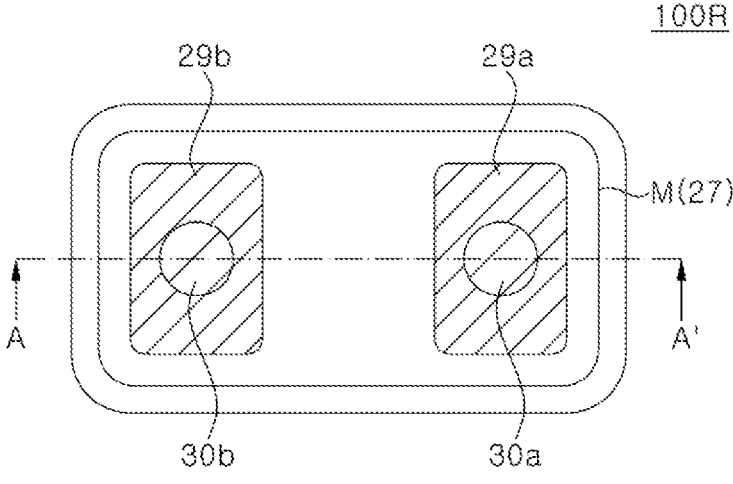
FIG. 3A is a schematic plan view illustrating a light emitting device according to an exemplary embodiment.
Figure 3B:
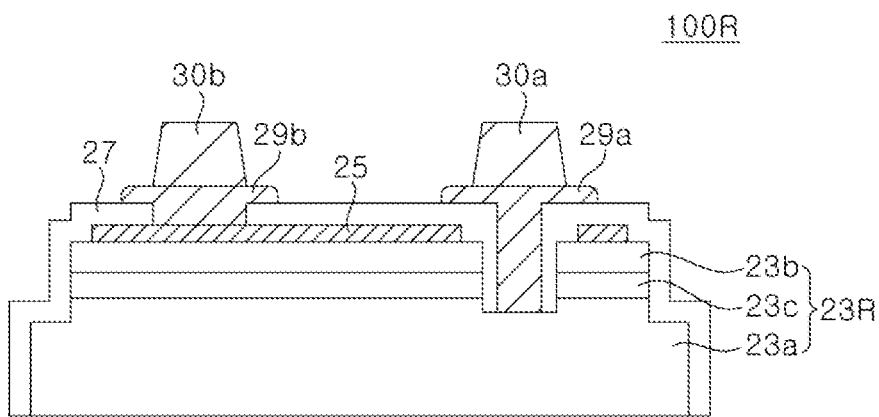
FIG. 3B is a schematic cross-sectional view taken along line A-A' of FIG. 3A.

FIG. 3A is a schematic plan view illustrating a light emitting device according to an exemplary embodiment, and FIG. 3B is a schematic cross-sectional view taken along line A-A' of FIG. 3A.

In FIGS. 3A and 3B, although bump pads 30a and 30b are exemplarily illustrated and described as being disposed at an upper side in the drawings, in some exemplary embodiments, the light emitting device 100R may be flip-bonded onto the circuit board 101 as shown in FIG. 2. In this case, the bump pads 30a and 30b may be disposed at a lower side of the first light emitting device 100R. Furthermore, in some exemplary embodiments, the bump pads 30a and 30b may be omitted.

Referring to FIGS. 3A and 3B, the first light emitting device 100R may include a first LED stack 23R, an ohmic electrode 25, an insulation layer 27, connectors 29a and 29b, and bump pads 30a and 30b. The first LED stack 23R includes a first conductivity type semiconductor layer 23a, a second conductivity type semiconductor layer 23b, and an active layer 23c.

The first LED stack 23R emits light having a first peak wavelength, which may be red light. In this case, the first LED stack 23R may include an AlGaInP-based well layer.

The ohmic electrode 25 is in ohmic contact with the second conductivity type semiconductor layer 23b. The ohmic electrode 25 may include a reflective metal layer reflecting light generated by the first LED stack 23. However, the inventive concepts are not limited thereto, and the ohmic electrode 25 may be formed using a transparent oxide layer or a metal layer, such as indium tin oxide (ITO). The ohmic electrode 25 may cover substantially the entire surface of the second conductivity type semiconductor layer 23b. In this manner, current may be widely spread in the first light emitting device 100R.

The connector 29a may be electrically connected to the first conductivity type semiconductor layer 23a. The connector 29a may be connected to the first conductivity type semiconductor layer 23a through a through hole passing through the second conductivity type semiconductor layer 23b and the active layer 23c, but the inventive concepts are not limited thereto. For example, in some exemplary embodiments, the connector 29a may be connected to the first conductivity type semiconductor layer 23a exposed through mesa etching. Further, in other exemplary embodiments, an ohmic electrode may be additionally formed on the first conductivity type semiconductor layer 23a, and the connector 29a may be connected to the ohmic electrode.

The connector 29a may be insulated from the second conductivity type semiconductor layer 23b and the active layer 23c by the insulation layer 27. The insulation layer 27 may also cover the second conductivity type semiconductor layer 23b and the ohmic electrode 25. As illustrated in the drawing, the connector 29a may provide a relatively wide pad on the insulation layer 27.

The connector 29b may be electrically connected to the ohmic electrode 25. As illustrated in the drawing, the connector 29b may be connected to the ohmic electrode 25 through the insulation layer 27. The connector 29b may provide a relatively wide pad on the insulation layer 27. However, the inventive concepts are not limited thereto, and in some exemplary embodiments, the connector 29b may be formed on the ohmic electrode 25 without overlapping the insulation layer 27.

The bump pads 30a and 30b may be disposed on the connectors 29a and 29b, respectively. The bump pads 30a and 30b may be used as bonding pads when bonding the first light emitting device 100R on the circuit board 101. In another exemplary embodiment, the bump pads 30a and 30b may be omitted, and the connectors 29a and 29b may be used as bonding pads.

The first light emitting device 100R according to the illustrated exemplary embodiment may be formed by growing the first conductivity type semiconductor layer 23a, the active layer 23c, and the second conductivity type semiconductor layer 23b on a growth substrate, such as a GaAs substrate, forming the ohmic electrode 25, the connectors 29a and 29b, and the bump pads 30a and 30b, and then removing the growth substrate. As such, the first light emitting device 100R may not include the growth substrate. However, the inventive concepts are not limited thereto, and the structure and the shape of the first light emitting device 100R may be varied.

Figure 4A:
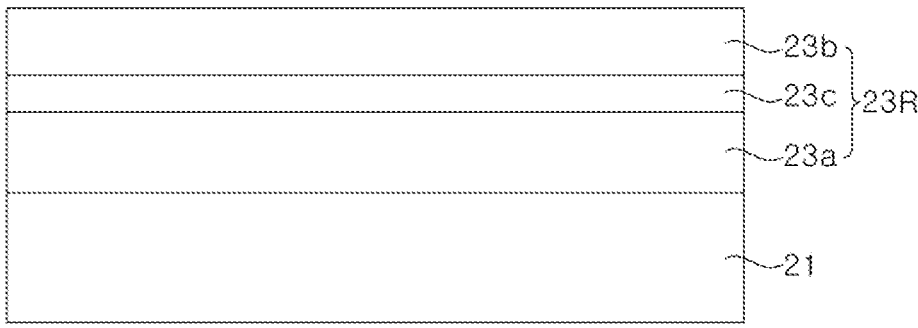
FIGS. 4A, 4B, and 4C are schematic cross-sectional views illustrating a first light emitting device according to exemplary embodiments.
Figure 4B:
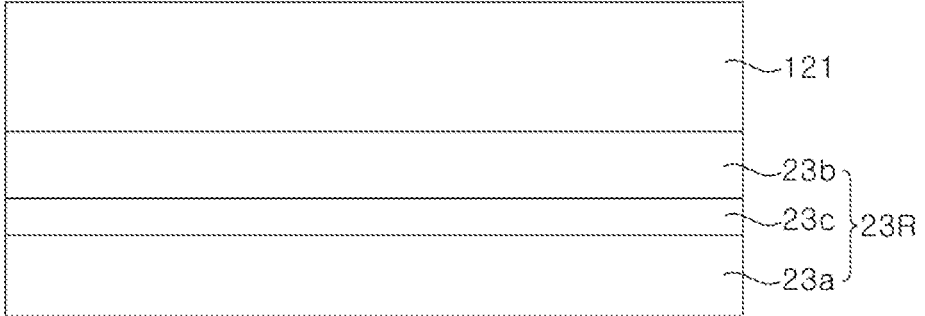
Figure 4C:
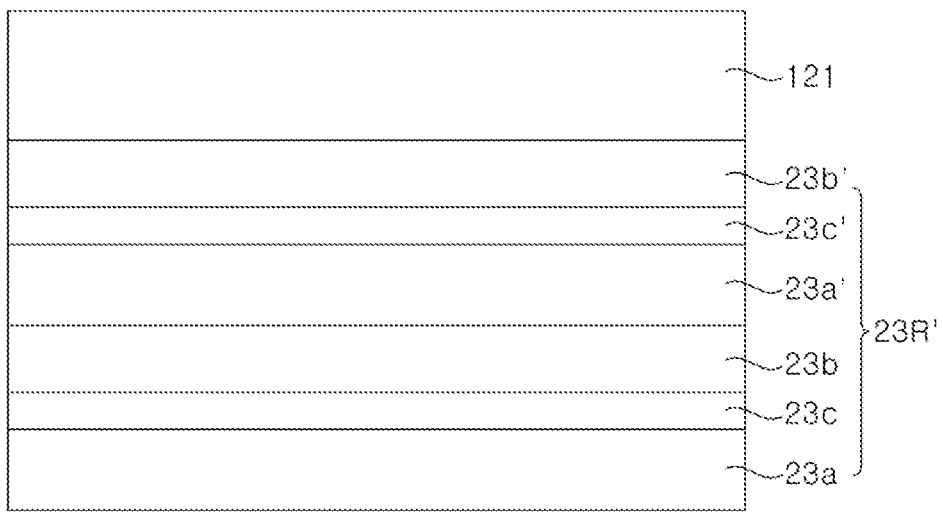

FIGS. 4A, 4B, and 4C are schematic cross-sectional views illustrating a first light emitting device according to exemplary embodiments.

Referring to FIG. 4A, a first light emitting device 100R' according to the illustrated exemplary embodiment may include a growth substrate 21. The growth substrate 21 may be, for example, a GaAs substrate, but the inventive concepts are not limited thereto.

Connectors and bump pads may be formed over or under the growth substrate 21 so that light generated from an active layer 23c may be emitted to the outside.

Referring to FIG. 4B, a first light emitting device 100R" according to the illustrated exemplary embodiment includes a window layer 121 instead of the growth substrate 21. For example, as shown in FIG. 4A, after growing a first conductivity type semiconductor layer 23a, an active layer 23c, and a second conductivity type semiconductor layer 23b on the growth substrate 21, the window layer 121 may be formed on the second conductivity type semiconductor layer 23b, and then, the growth substrate 21 may be removed to provide the first light emitting device 100R".

Light generated from the active layer 23c may be emitted to the outside through the window layer 121. In this case, connectors and bump pads may be formed under the first conductivity type semiconductor layer 23a to emit light through the window layer 121.

Referring to FIG. 4C, a first light emitting device 100R" according to the illustrated exemplary embodiment includes two active layers 23c and 23c' formed by tunnel junction. For example, a first LED stack 23R' may be formed by sequentially growing a first conductivity type semiconductor layer 23a, an active layer 23c, a second conductivity type semiconductor layer 23b, a first conductivity type semiconductor layer 23a', an active layer 23c', and a second conductivity type semiconductor layer 23b' on a growth substrate, and the second conductivity type semiconductor layer 23b and the first conductivity type semiconductor layer 23a' may be coupled by a tunnel junction layer.

A window layer 121 may then be formed as in that shown in FIG. 4B, and the growth substrate is removed to provide the first light emitting device 100"' having a stacked structure of FIG. 4C. However, the inventive concepts are not limited thereto, and in some exemplary embodiments, the growth substrate may be removed without forming the window layer 121 or the growth substrate may be retained in the first light emitting device 100R"'.

Figure 5A:
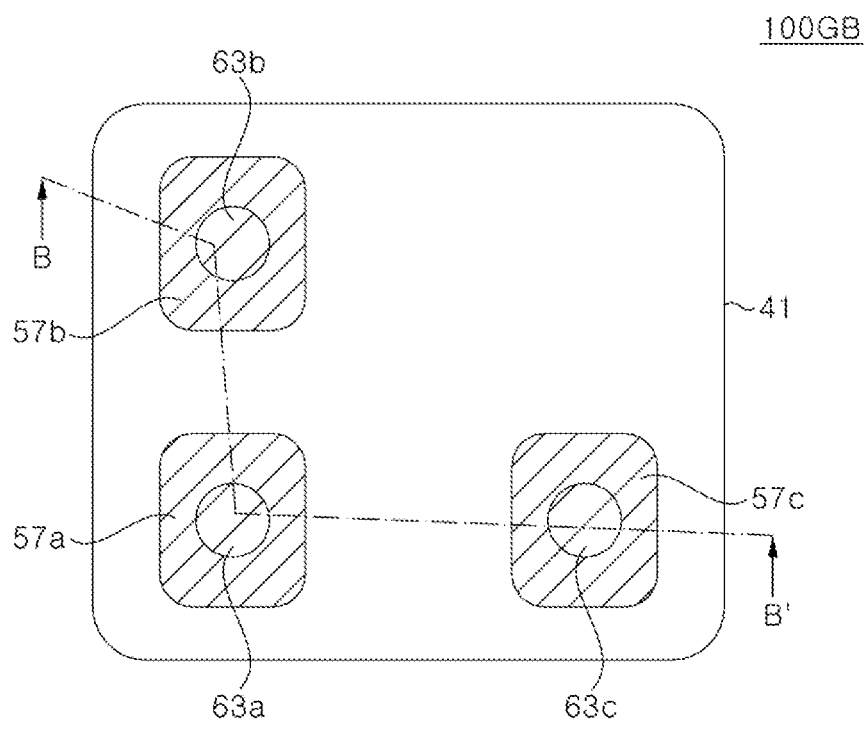
FIG. 5A is a schematic plan view illustrating a second light emitting device according to an exemplary embodiment.
Figure 5B:
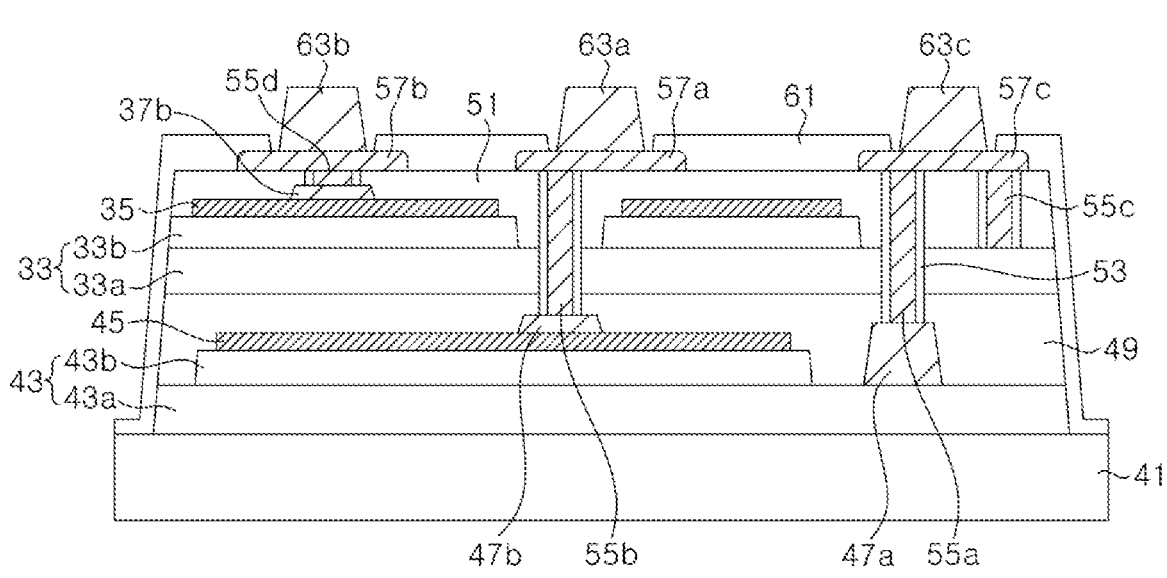
FIG. 5B is a schematic cross-sectional view taken along line B-B' of FIG. 5A.

FIG. 5A is a schematic plan view illustrating a second light emitting device according to an exemplary embodiment, and FIG. 5B is a schematic cross-sectional view taken along line B-B' of FIG. 5A.

In FIGS. 5A and 5B, although bump pads 63a, 63b, and 63c are exemplarily illustrated and described as being disposed at an upper side of the second light emitting device 100GB, the inventive concepts are not limited thereto. For example, in some exemplary embodiments, the light emitting device 100GB may be flip-bonded on the circuit board 101 as shown in FIG. 2, and in this case, the bump pads 63a, 63b, and 63c may be disposed at a lower side of the second light emitting device 100GB. Furthermore, in some exemplary embodiments, the bump pads 63a, 63b, and 63c may be omitted.

Referring to FIGS. 5A and 5B, the second light emitting device 100GB includes a second LED stack 33, a third LED stack 43, a second ohmic electrode 35, and a third ohmic electrode 45, an n-electrode pad 47a, a lower p-electrode pad 47b, an upper p-electrode pad 37b, a bonding layer 49, a lower insulation layer 51, a sidewall insulation layer 53, buried layers 55a, 55c, and 55d, connectors 57a, 57b, and 57c, an upper insulation layer 61, and bump pads 63a, 63b, and 63c.

As shown in FIG. 5B, the second LED stack 33 and the third LED stack 43 according to the illustrated exemplary embodiment overlap each other in the vertical direction. Each of the LED stacks 33 and 43 is grown on different growth substrates, and the growth substrate on which the second LED stack 33 is grown is separated from the second LED stack 33. In addition, a substrate 41 may be a growth substrate for growing the third LED stack 43, and may be retained or be removed in the second light emitting device 100GB.

Each of the second LED stack 33 and the third LED stack 43 includes a first conductivity type semiconductor layer 33a or 43a, a second conductivity type semiconductor layer 33b or 43b, and an active layer interposed therebetween. In particular, the active layer may have a multi-quantum well structure. As used herein, the first conductivity type semiconductor layers 23a, 33a, and 43a of each LED stack 23, 33 or 43 may be n-type semiconductor layers, and the second conductivity type semiconductor layers 23b, 33b, and 43b may be p-type semiconductor layers, without being limited thereto.

In an exemplary embodiment, the third LED stack 43 is disposed under the second LED stack 33. Accordingly, the second LED stack 33 may be referred to as an upper LED stack and the third LED stack 43 may be referred to as a lower LED stack. However, as shown in FIG. 2, it should be noted that when the second light emitting device 100GB is mounted on the circuit board 101, upper and lower positions of the second light emitting device 100GB may be reversed.

Light generated from the second and third LED stacks 33 and 43 may be emitted to the outside through the third LED stack 43. More particularly, light generated from the third LED stack 43 may be directly emitted to the outside, and light generated from the second LED stack 33 may be emitted to the outside through the third LED stack 43.

The second and third LED stacks 33 and 43 may emit light having a shorter wavelength than light emitted from the first LED stack 23R that has the first peak wavelength. Furthermore, in an exemplary embodiment, the second LED stack 33 emits light having a second peak wavelength that is longer than that emitted from the third LED stack 43, and the third LED stack 43 emits light having a third peak wavelength that is a shorter than the first and second peak wavelengths. For example, the second LED stack 33 may be an inorganic light emitting diode emitting green light, and the third LED stack 43 may be an inorganic light emitting diode emitting blue light. In this case, the second LED stack 33 may include an AlGaInP-based or AlGaInN-based well layer, and the third LED stack 43 may include an AlGaInN-based well layer. Since the second LED stack 33 emits light having a longer wavelength than that emitted from the third LED stack 43, light generated from the second LED stack 33 may be emitted to the outside after passing through the third LED stacks 43.

In another exemplary embodiment, the second LED stack 33 may emit light having a second peak wavelength that is shorter than that emitted from the third LED stack 43, and the third LED stack 43 may emit light having a third peak wavelength that is longer than the second peak wavelength. For example, the second LED stack 33 may be an inorganic light emitting diode emitting blue light, and the third LED stack 43 may be an inorganic light emitting diode emitting green light. In this case, the third LED stack 43 may include an AlGaInP-based or AlGaInN-based well layer, and the second LED stack 33 may include an AlGaInN-based well layer. Since the second LED stack 33 emits light having a shorter wavelength than that emitted from the third LED stack 43, a portion of light generated from the second LED stack 33 may be absorbed and lost by the third LED stack 43.

In general, external quantum efficiency of the LED emitting blue light is relatively high compared to that of the LED emitting green light. When the second LED stack 33 emits green light and the third LED stack 43 emits blue light, a ratio of luminous intensities of green light and blue light may not satisfy a mixing ratio required for a display. For example, the mixing ratio of luminous intensity required in the display is generally determined, such that the ratio of luminous intensities of red:green:blue is close to 3:6:1. However, when the luminous intensity of the blue light is excessively high, it is difficult to satisfy the mixing ratio of the luminous intensities, thereby making it difficult to realize a favorable color image. Accordingly, by forming the second light emitting device 100GB so that the second LED stack 33 emits blue light and the third LED stack 43 emits green light, a portion of blue light may be absorbed and lost by the third LED stack 43, and thus, the luminous intensity of blue light may be reduced, thereby adjusting the mixing ratio of luminous intensities to a desired level.

Further, to adjust the light mixing ratio, a luminous area of the second LED stack 33 may be less than that of the third LED stack 43.

In the illustrated exemplary embodiment, an upper surface of the second LED stack 33 may be a p-type semiconductor layer 33b, and an upper surface of the third LED stack 43 may be a p-type semiconductor layer 43b, without being limited thereto. The semiconductor layers of the second LED stack 33 are stacked in the same order as those of the third LED stack 43, and thus, process stability may be enhanced. To stack the second LED stack 33 in the same order as that of the third LED stack 43, a temporary bonding & debonding (TBDB) technique may be used.

The second LED stack 33 includes a mesa etching region, in which a portion of the second conductivity type semiconductor layer 33b is removed to expose an upper surface of the first conductivity type semiconductor layer 33a. As shown in FIG. 5B, buried layers 55a and may be formed through the mesa etching region of the second LED stack 33, and a buried layer 55c may also be formed on the mesa etching region of the second LED stack 33. Through holes passing through the second LED stack 33 may be formed to form the buried layers. The through holes may be formed to pass through the first conductivity type semiconductor layer 33a exposed in the mesa etching region, but the inventive concepts are not limited thereto, and in some exemplary embodiments, the through holes may pass through both the second conductivity type semiconductor layer 33b and the first conductivity type semiconductor layer 33a.

The third LED stack 43 may also include a mesa etching region formed by removing the second conductivity type semiconductor layer 43b to expose the upper surface of the first conductivity type semiconductor layer 43a.

A side surface of the second light emitting device 100GB may be inclined, such that a width of the second light emitting device 100GB may be gradually increase from the second LED stack 33 to the third LED stack 43. As such, a luminous area of the third LED stack 43 may be greater than that of the second LED stack 33. An inclination angle of the side surface of the second light emitting device 100GB with respect to the upper surface of the third LED stack 43 may be about 75 degrees to about 90 degrees. When the inclination angle is less than 75 degrees, the luminous area of the second LED stack 33 may become too small, and thus, it may be difficult to reduce a size of the second light emitting device 100GB.

The second ohmic electrode 35 is in ohmic contact with the second conductivity type semiconductor layer 33b of the second LED stack 33. As shown in the drawings, the second ohmic electrode 35 contacts the upper surface of the second LED stack 33. The second ohmic electrode 35 may be formed of a metal layer or a conductive oxide layer. For example, the conductive oxide layer may include $SnO_2$, $InO_2$, ITO, ZnO, IZO, or the like. The second ohmic electrode 35 may also include a reflective metal layer, such as Al or Ag.

The third ohmic electrode 45 is in ohmic contact with the second conductivity type semiconductor layer 43b of the third LED stack 43. The third ohmic electrode 45 may be disposed between the second LED stack 33 and the third LED stack 43, and contacts the upper surface of the third LED stack 43. The third ohmic electrode 45 may be formed of a metal layer or a conductive oxide layer that is transparent to light emitted from the second LED stack 33. For example, the conductive oxide layer may include $SnO_2$, $InO_2$, ITO, ZnO, IZO, or the like. In particular, the third ohmic electrode 45 may be formed of ZnO, which may be formed as a single crystal on the third LED stack 43. ZnO may have favorable electrical and optical characteristics as compared with the metal layer or other conductive oxide layers, as ZnO has a strong bonding force to the third LED stack 43. In this manner, the third LED stack 43 may remain undamaged even when the growth substrate is separated using a laser lift-off process during manufacture.

The third ohmic electrode 45 may be partially removed along an edge of the third LED stack 43, and, accordingly, an outer side surface of the third ohmic electrode 45 is not exposed to the outside, but may be covered with the bonding layer 49. In particular, the side surface of the third ohmic electrode 45 may be recessed inwardly than that of the third LED stack 43, and a region where the third ohmic electrode 45 is recessed may be filled with the bonding layer 49. The third ohmic electrode 45 may also be recessed near the mesa etching region of the third LED stack 43, and the recessed region may be filled with the bonding layer 49.

The n-electrode pad 47a is in ohmic contact with the first conductivity type semiconductor layer 43a of the third LED stack 43. The n-electrode pad 47a may be disposed on the first conductivity type semiconductor layer 43a exposed through the second conductivity type semiconductor layer 43b, that is, in the mesa etching region. The n-electrode pad 47a may be formed of, for example, Cr/Au/Ti. An upper surface of the n-electrode pad 47a may be placed higher than that of the second conductivity type semiconductor layer 43b and the third ohmic electrode 45. For example, a thickness of the n-electrode pad 47a may be about 2 μm or more. The n-electrode pad 47a may have a shape of a truncated cone, but the inventive concepts are not limited thereto. For example, the n-electrode pad 47a may have various shapes, such as a truncated pyramid, a cylindrical shape, or a square cylindrical shape. In another exemplary embodiment, the n-electrode pad 47a may be omitted.

The lower p-electrode pad 47b may include substantially the same material as the n-electrode pad 47a. An upper surface of the lower p-electrode pad 47b may be located at the substantially the same elevation as that of the n-electrode pad 47a. As such, a thickness of the lower p-electrode pad 47b may be less than that of the n-electrode pad 47a. More particularly, the thickness of the lower p-electrode pad 47b may be approximately equal to a thickness of a portion of the n-electrode pad 47a protruding above the second ohmic electrode 45. For example, the thickness of the lower p-electrode pad 47b may be about 1.2 μm or less. The upper surface of the lower p-electrode pad 47b is set to be located at substantially the same elevation as that of the n-electrode pad 47a, and thus, the lower p-electrode pad 47b and the n-electrode pad 47a may be simultaneously exposed when the through holes passing through the second LED stack 33 are formed. When the elevations of the n-electrode pad 47a and the lower p-electrode pad 47b are different, any one of the electrode pads may be severely damaged during the etching process. As such, the elevations of the n-electrode pad 47a and the lower p-electrode pad 47b are set to be approximately equal to prevent any one of the electrode pads from being damaged during the etching process or the like.

The bonding layer 49 couples the second LED stack 33 to the third LED stack 43. The bonding layer 49 may be disposed between the first conductivity type semiconductor layer 33a and the third ohmic electrode 45, and couple the first conductivity type semiconductor layer 33a and the third ohmic electrode 45. The bonding layer 49 may partially contact the second conductivity type semiconductor layer 43b, and may partially contact the first conductivity type semiconductor layer 43a exposed in the mesa etching region. In addition, the bonding layer 49 may cover the n-electrode pad 47a and the lower p-electrode pad 47b.

The bonding layer 49 may be formed of a transparent organic material layer, or may be formed of a transparent inorganic material layer. For example, the organic material layer may include SUB, poly methylmethacrylate (PMMA), polyimide, parylene, benzocyclobutene (BCB), or the like, and the inorganic material layer may include $Al_2O_3$, $SiO_2$, SiNx, or the like. In addition, the bonding layer 49 may be formed of spin-on-glass (SOG).

The upper p-electrode pad 37b may be disposed on the second ohmic electrode 35. As shown in FIG. 5B, the upper p-electrode pad 37b may be covered with the lower insulation layer 51. The upper p-electrode pad 37b may be formed of Ni/Au/Ti, for example, and may be formed to have a thickness of about 2 μm.

The lower insulation layer 51 is formed on the second LED stack 33, and covers the second ohmic electrode 35. The lower insulation layer 51 may also cover the mesa etching region of the second LED stack 33 to provide a flat upper surface. The lower insulation layer 51 may be formed of $SiO_2$, for example.

Through holes passing through the lower insulation layer 51 may be formed, and the buried layers 55a, 55b, 55c, and 55d may be formed in the through holes. At least two through holes pass through the lower insulation layer 51, the second LED stack 33, and the bonding layer 49 to expose the n-electrode pad 47a and the lower p-electrode pad 47b, respectively. In addition, at least one through hole exposes the first conductivity type semiconductor layer 33a of the second LED stack 33. Furthermore, at least one through hole exposes the upper p-electrode pad 37b.

The sidewall insulation layer 53 covers sidewalls of the through holes, and has openings exposing bottoms of the through holes. The sidewall insulation layer 53 may be formed using, for example, a chemical vapor deposition technique or an atomic layer deposition technique, and may be formed of, for example, $Al_2O_3$, $SiO_2$, $Si_3N_4$, or the like. In some exemplary embodiments, the sidewall insulation layer 53 in a portion of through holes may be omitted. In particular, the sidewall insulation layer 53 in the through hole exposing the n-electrode pad 47a, the sidewall insulation layer 53 in the through hole exposing the first conductivity type semiconductor layer 33a, and/or the sidewall insulation layer 53 in the through hole exposing the upper p-electrode pad 37b may be omitted.

The buried layers 55a, 55b, 55c, and 55d may fill the through holes, respectively. The buried layer 55b is electrically insulated from the second LED stack 33 by the sidewall insulation layer 53.

The buried layer 55a may be electrically connected to the n-electrode pad 47a, the buried layer 55b may be electrically connected to the lower p-electrode pad 47b, and the buried layer 55c may be electrically connected to the first conductivity type semiconductor layer 33a of the second LED stack 33. In addition, the buried layer 55d may be electrically connected to the upper p-electrode pad 37b.

The buried layers 55a, 55b, 55c, and 55d may be formed using a chemical mechanical polishing technique. For example, after forming a seed layer and filling the through holes using a plating technique, the buried layers 55a, 55b, 55c, and 55d may be formed by removing metal layers on the lower insulation layer 51 using the chemical mechanical polishing technique. Furthermore, a metal barrier layer may be formed before forming the seed layer.

The buried layers 55a, 55b, 55c, and 55d may be formed together through the same process. Accordingly, upper surfaces of the buried layers 55a, 55b, 55c, and 55d may be substantially flush with the lower insulation layer 51. However, the inventive concepts are not limited thereto, and in some exemplary embodiments, the buried layers 55a, 55b, 55c, and 55d may be formed through different processes from one another.

The connectors 57a, 57b, and 57c are formed on the lower insulation layer 51. The common connector 57c may be commonly connected to the buried layer 55a and the buried layer 55c, the connector 57a may be connected to the buried layer 55b, and the connector 57b may be connected to the buried layer 55d.

The first conductivity type semiconductor layer 33a of the second LED stack 33 and the first conductivity type semiconductor layer 43a of the third LED stack 43 are electrically connected to each other by the common connector 57c and the buried layers 55a and 55c. Meanwhile, the connectors 57a and 57b are electrically spaced apart from each other, and are electrically connected to the second conductivity type semiconductor layers 33b and 43b, respectively.

The connectors 57a, 57b, and 57c may be formed of the same material through the same process, and may be formed of, for example, a multiple layer structure of Ni/Au/Ti.

The upper insulation layer 61 covers the lower insulation layer 51, and covers the connectors 57a, 57b, and 57c. The upper insulation layer 61 may also cover side surfaces of the second and third LED stacks 33 and 43. The upper insulation layer 61 may have openings exposing the connectors 57a, 57b, and 57c. The upper insulation layer 61 may be formed of a silicon oxide film or a silicon nitride film, and may be formed to have a thickness of about 400 nm, for example.

The bump pads 63a, 63b, and 63c may be disposed on the connectors 57a, 57b, and 57c in the openings of the upper insulation layer 61, respectively, and electrically connected to the connectors 57a, 57b, and 57c.

The first bump pad 63a may be electrically connected to the second conductivity type semiconductor layer 43b of the third LED stack 43 through the upper connector 57a, the buried layer 55b, the buried layer 55b, the lower p-electrode pad 47b, and the third ohmic electrode 45. The second bump pad 63b may be electrically connected to the second conductivity type semiconductor layer 33b of the second LED stack 33 through the connector 57b, the buried layer 55d, and the second ohmic electrode 35.

The common bump pad 63c may be commonly electrically connected to the first conductivity type semiconductor layers 33a and 43a of the second and third LED stacks 33 and 43 through the common connector 57c, the buried layers 55a and 55c, and the lower n-electrode pad 47a.

More particularly, the first and the second bump pads 63a and 63b are electrically connected to the second conductivity type semiconductor layers 33b and 43b of the second and third LED stacks 33 and 43, respectively. The common bump pad 63c is commonly electrically connected to the first conductivity type semiconductor layers 33a and 43a of the second and third LED stacks 33 and 43.

The bump pads 63a, 63b, and 63c may be disposed in the openings of the upper insulation layer 61, and upper surfaces of the bump pads 63a, 63b, and 63c may be substantially flat. The bump pads 63a, 63b, and 63c may be disposed on the flat surfaces of the connectors 57a, 57b, and 57c. The bump pads 63a, 63b, and 63c may be formed of Au/In, and for example, Au may be formed to have a thickness of about 3

μm, and In may be formed to have a thickness of about 1 μm. The second light emitting device 100GB may be bonded to pads on the circuit board 101 using In. In the illustrated exemplary embodiment, it is described that the bump pads are bonded using In, but the inventive concepts are not limited to In, and in some exemplary embodiments, the second light emitting device 100GB may be bonded to the pads using Pb or AuSn of the bump pads.

According to the illustrated exemplary embodiment, the first LED stack 23 is electrically connected to the bump pads 30a and 30b, the second LED stack 33 is electrically connected to the bump pads 63b and 63c, and the third LED stack 43 is electrically connected to the bump pads 63a and 63c, and thus, the first, second, and third LED stacks 23, 33, and 43 may be independently driven.

In the illustrated exemplary embodiment, the second light emitting device 100GB includes a common cathode electrode, to which the first conductivity type semiconductor layers 33a and 43a of the second and third LED stacks 33 and 43 are electrically connected, and individual anode electrodes. Furthermore, the first conductivity type semiconductor layer 23a of the first light emitting device 100R may be electrically connected to the common cathode electrode through the circuit board 101. When the common cathode electrode is included, the first light emitting device 100R and the second light emitting device 100GB may be driven using different driving power sources from each other. As such, the first light emitting device 100R may be electrically spaced apart from the second light emitting device 100GB.

However, the inventive concepts are not limited thereto, the second light emitting device 100GB may include a common anode electrode and individual cathode electrodes, and the second conductivity type semiconductor layer 23b of the first light emitting device 100R may be electrically connected to the common anode electrode through the circuit board 101.

In the illustrated exemplary embodiment, the bump pads 63a, 63b, and 63c are described as being formed, but in some exemplary embodiments, the bump pads may be omitted. In particular, when the second light emitting device 100GB is bonded to the circuit board 101 using an anisotropic conductive film or an anisotropic conductive paste, the bump pads may be omitted, and in this case, the connectors 57a, 57b, and 57c may be directly bonded. In this manner, a bonding area may be increased.

Figure 6A:
FIGS. 6A and 6B are schematic cross-sectional views illustrating a second light emitting device according to exemplary embodiments.
Figure 6B:
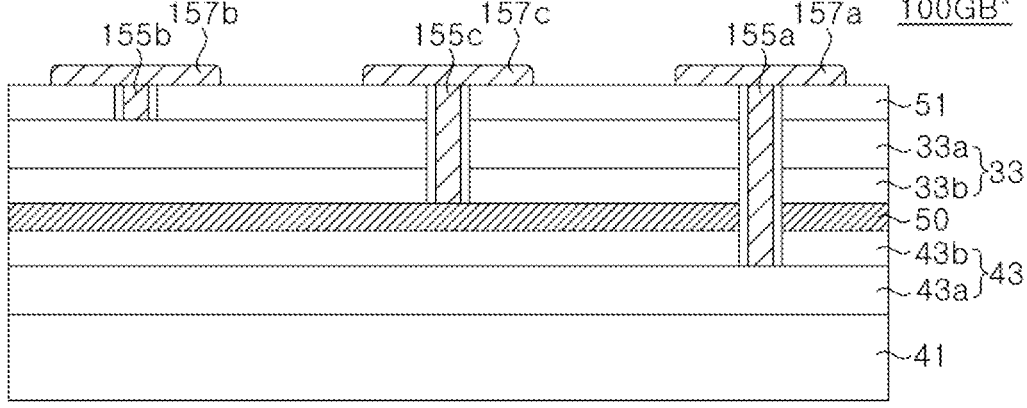

FIGS. 6A and 6B are schematic cross-sectional views illustrating a second light emitting device according to exemplary embodiments.

Referring to FIG. 6A, a second light emitting device 100GB' according to the illustrated exemplary embodiment is substantially similar to the second light emitting device 100GB described with reference to FIGS. 5A and 5B, but a second LED stack 33 in the second light emitting device 100GB' has a stacked sequence different from that of the second light emitting device 100GB. More particularly, a second ohmic electrode 35 is disposed to face a third LED stack 43, and a first conductivity type semiconductor layer 33a is disposed on a second conductivity type semiconductor layer 33b.

The second light emitting device 100GB' may be formed without using a TBDB process by removing a growth substrate from the second LED stack 33 after bonding the second LED stack 33 to the third LED stack 43 using a bonding layer 149, so that the second LED stack 33 faces the third LED stack 43.

Thereafter, electrodes connecting to the second LED stack 33 and the third LED stack 43 may be formed to have a common cathode electrode or a common anode electrode.

In the illustrated exemplary embodiment, the second ohmic electrode 35 and a third ohmic electrode 45 are bonded to each other by the bonding layer 149. The bonding layer 149 may include substantially the same material as the bonding layer 49 described above.

Since the second ohmic electrode 35 is disposed on a path of light generated from the second LED stack 33, the second ohmic electrode 35 may be formed of a transparent oxide layer or a metal layer that transmits light generated from the second LED stack 33.

Referring to FIG. 6B, in a second light emitting device 100GB" according to the illustrated exemplary embodiment, the second LED stack 33 and the third LED stack 43 are bonded by a conductive material layer 50. The conductive material layer 50 may be a transparent oxide layer or a metal layer. For example, the conductive material layer 50 may be an indium tin oxide (ITO) layer, and thus, the second conductivity type semiconductor layers 33*b* and 43*b* may be electrically connected to each other.

In the illustrated exemplary embodiment, a buried layer 155*c* and a common connector 157*c* may be electrically connected to the conductive material layer 50, and thus, a common anode electrode may be provided. Meanwhile, a buried layer 155*a* and a connector 157*a* are electrically connected to a first conductivity type semiconductor layer 43*a* of the third LED stack 43, and a buried layer 155*b* and a connector 157*b* are electrically connected to the first conductivity type semiconductor layer 33*a* of the second LED stack 33.

Figure 7:
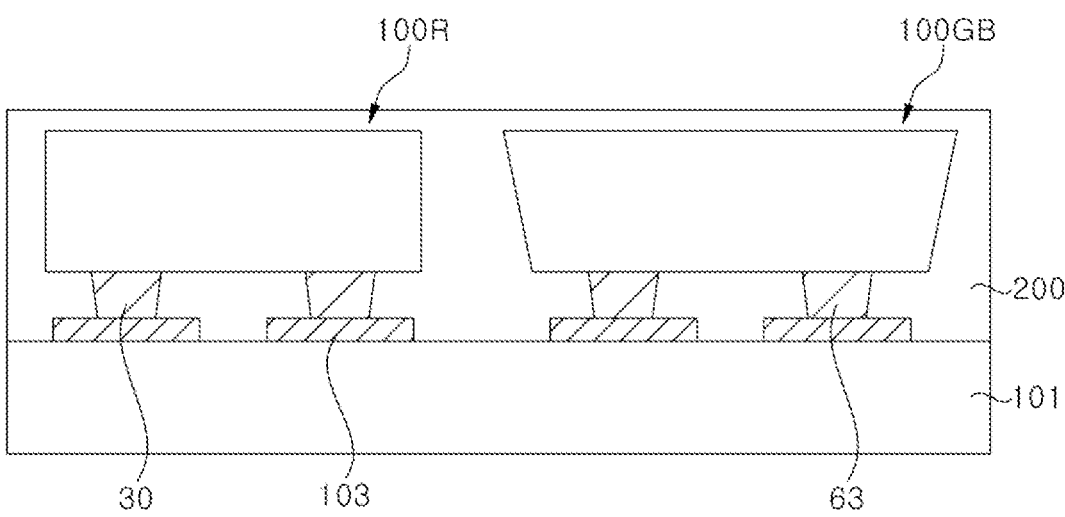
FIG. 7 is a schematic cross-sectional view illustrating a display panel according to another exemplary embodiment.

FIG. 7 is a schematic cross-sectional view illustrating a display panel according to another exemplary embodiment.

Referring to FIG. 7, the display panel according to the illustrated exemplary embodiment is similar to the display panel described with reference to FIG. 2, but the display panel further includes a light blocking material 200.

A circuit board 101 may include pads 103 exposed on a surface thereof, and a first light emitting device 100R and a second light emitting device 100GB may be bonded to the pads 103 using bump pads 30 and 63.

As described above, the first light emitting device 100R may include two bump pads 30, and the second light emitting device 100GB may include three bump pads 63, but the inventive concepts are not limited thereto. In addition, connectors 29*a*, 29*b*, 57*a*, 57*b*, and 57*c* other than the bump pads 63 may be bonded to the pads 103.

Although the pads to which the first light emitting device 100R is bonded and the pads to which the second light emitting device 100GB is bonded are shown to be separated from each other, one of the pads to which the first light emitting device 100R is bonded and one of the pads to which the second light emitting device 100GB is bonded may be connected to each other. In this case, the first light emitting device 100R and the second light emitting device 100GB may be connected in a common cathode or common anode structure.

As illustrated in FIG. 7, upper surfaces of the first light emitting device 100R and the second light emitting device 100GB disposed on the circuit board 101 may be placed at substantially the same elevation. As such, light having a first peak wavelength emitted through the first light emitting device 100R and light having a second and third peak wavelengths emitted through the second light emitting device 100GB may be emitted to the outside at the same elevation.

The light blocking material 200 covers side surfaces of the first light emitting device 100R and the second light emitting device 100GB. The light blocking material 200 blocks light emitted to side surfaces of the first light emitting device 100R and the second light emitting device 100GB to prevent interference between the light emitting devices. The light blocking material 200 may also cover the upper surfaces of the first light emitting device 100R and the second light emitting device 100GB, as shown in FIG. 7. However, a thickness of the light blocking material 200 covering the upper surfaces of the first light emitting device 100R and the second light emitting device 100GB may be small, and thus, light emitted from the first and second light emitting devices 100G and 100GB may be emitted to the outside through the light blocking material 200.

The light blocking material 200 may be formed of a light reflecting material or a light absorbing material. For example, the light blocking material 200 may be a black epoxy molding material.

In the illustrated exemplary, although the upper surfaces of the first light emitting device 100R and the second light emitting device 100GB are illustrated and described as being placed at the same elevation, the inventive concepts are not limited thereto. For example, the upper surface of the second light emitting device 100GB may be placed higher than that of the first light emitting device 100R. As such, when the first light emitting devices 100R are mounted first, and then the second light emitting devices 100GB are mounted, the first light emitting devices 100R may be prevented from being damaged.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:

a circuit board;

a plurality of emitters arranged on the circuit board; and a light blocking material disposed on the emitters, wherein:

at least one of the emitters includes a first light emitting device and a second light emitting device spaced apart from each other;

the first light emitting device includes a first bump pad and a first LED stack configured to generate light including a first peak wavelength;

the second light emitting device includes a second bump pad and a second LED stack configured to generate light including a second peak wavelength;

the first bump pad and the second bump pad are electrically connected to each other;

light emitted from the at least one of the emitters is configured to be emitted to the outside through the light blocking material;

the first light emitting device includes a plurality of first semiconductor layers including a first side surface including a region inclined at a first inclined angle, and the second light emitting device includes a plurality of second semiconductor layers including a second side surface facing the first side surface and including a region inclined at a second inclined angle different from the first inclined angle;

the second light emitting device includes a first emission region configured to emit a shorter peak wavelength light and a second emission region configured to emit a longer peak wavelength light relative to the shorter peak wavelength light; and an area of the first emission region is smaller than an area of the second emission region.

2. The display apparatus of claim 1, wherein the first peak wavelength is longer than the second peak wavelength.

3. The display apparatus of claim 1, wherein the first LED stack is configured to emit one of red light, blue light, and green light, and the second LED stack is configured to emit one of red light, blue light, and green light.

4. The display apparatus of claim 1, wherein an upper surface of the second light emitting device is placed higher than that of the first light emitting device.

5. The display apparatus of claim 1, wherein upper surfaces of the first light emitting device and the second light emitting device are placed at substantially the same elevation.

6. The display apparatus of claim 1, wherein:

each of the first and second LED stacks includes a first conductivity type semiconductor layer and a second conductivity type semiconductor layer; and the second light emitting device includes a common anode electrode electrically connected to the second conductivity type semiconductor layers of the second LED stack, or a common cathode electrode electrically connected to the first conductivity type semiconductor layers of the second LED stack.

7. The display apparatus of claim 6, wherein the first conductivity type semiconductor layer or the second conductivity type semiconductor layer of the first LED stack is electrically connected to the common anode electrode or the common cathode electrode.

8. The display apparatus of claim 6, wherein the second light emitting device includes at least two quantum well layers stacked.

9. The display apparatus of claim 1, wherein:

the circuit board extends in a first direction and in a second direction with respect to a displayed screen; and the first and second light emitting devices in the same emitter are spaced apart in the second direction.

10. A display apparatus, comprising:

a circuit board; and a plurality of emitters arranged on the circuit board, wherein at least one of the emitters includes:

a first light emitting device including a first LED stack configured to generate light including a first peak wavelength; and a second light emitting device including a second LED stack spaced apart from the first LED stack and configured to generate light including a second peak wavelength different from the first peak wavelength;

wherein the first light emitting device includes a plurality of first semiconductor layers including a first side surface including a region inclined at a first inclined angle, and the second light emitting device includes a plurality of second semiconductor layers including a second side surface facing the first side surface and including a region inclined at a second inclined angle different from the first inclined angle;

the second light emitting device includes a first emission region configured to emit a shorter peak wavelength light and a second emission region configured to emit a longer peak wavelength light relative to the shorter peak wavelength light; and an area of the first emission region is smaller than an area of the second emission region.

11. The display apparatus of claim 10, wherein:

the circuit board extends in a first direction and a second direction with respect to a displayed screen; and the first and second LED stacks in the same emitter are spaced apart in the second direction.

12. The display apparatus of claim 10, wherein the first peak wavelength is longer than the second peak wavelength.

13. The display apparatus of claim 10, wherein an upper surface of the second light emitting device is placed at a different elevation than that of the first light emitting device.

14. The display apparatus of claim 1, wherein:

each of the first and second LED stacks includes a first conductivity type semiconductor layer and a second conductivity type semiconductor layer; and the first LED stack includes an AlGaInP layer and the second LED stack includes an AlGaInN layer.

15. A display apparatus, comprising:

a circuit board; and a plurality of emitters arranged on the circuit board, wherein at least one of the emitters includes:

a first light emitting device including a first LED stack configured to generate light including a first peak wavelength; and a second light emitting device including a second LED stack spaced apart from the first LED stack and configured to generate light including a second peak wavelength;

wherein the light including the first peak wavelength and the light including the second peak wavelength are emitted independently, wherein the first light emitting device includes a plurality of first semiconductor layers including a first side surface including a region inclined at a first inclined angle, and the second light emitting device includes a plurality of second semiconductor layers including a second side surface facing the first side surface and including a region inclined at a second inclined angle different from the first inclined angle, the second light emitting device includes a first emission region configured to emit a shorter peak wavelength light and a second emission region configured to emit a longer peak wavelength light relative to the shorter peak wavelength light, and an area of the first emission region is smaller than an area of the second emission region.

16. The display apparatus of claim 15, wherein:

each of the first and second LED stacks includes a first conductivity type semiconductor layer and a second conductivity type semiconductor layer; and the second light emitting device includes a common anode electrode electrically connected to the second conductivity type semiconductor layers of the second LED stack, or a common cathode electrode electrically connected to the first conductivity type semiconductor layers of the second LED stack.

17. The display apparatus of claim 16, wherein the first conductivity type semiconductor layer or the second conductivity type semiconductor layer of the first LED stack is electrically connected to the common anode electrode or the common cathode electrode.

18. The display apparatus of claim 15, wherein the second light emitting device includes at least two quantum well layers stacked.

19. The display apparatus of claim 15, wherein:

the circuit board extends in a first direction and in a second direction with respect to a displayed screen; and the first and second light emitting devices in the same emitter are spaced apart in the second direction.

20. The display apparatus of claim 15, wherein:

each of the first and second LED stacks includes a first conductivity type semiconductor layer and a second conductivity type semiconductor layer; and the first LED stack includes an AlGaInP layer and the second LED stack includes an AlGaInN layer.

* * * * *